United States Patent [19]

Hishida et al.

[11] Patent Number: 5,155,564
[45] Date of Patent: Oct. 13, 1992

[54] THIN-FILM TRANSISTOR ARRAY

[75] Inventors: Tadanori Hishida, Kashihara; Hajime Shoji, Higashiosaka; Hiroshi Hamada, Nara; Hisato Nagatomi, Tenri, all of Japan

[73] Assignee: Sharp Kabushiki Kaisha, Osaka, Japan

[21] Appl. No.: 617,921

[22] Filed: Nov. 21, 1990

Related U.S. Application Data

[63] Continuation of Ser. No. 371,221, Jun. 26, 1989, abandoned.

[30] Foreign Application Priority Data

Jul. 1, 1988 [JP] Japan .................. 63-165464

[51] Int. Cl.$^5$ ............... H01L 27/120; H01L 27/105; H01L 23/485; H01L 29/540
[52] U.S. Cl. ...................... 357/23.7; 357/4; 357/45; 357/71
[58] Field of Search ............ 357/2, 23.7, 4, 23.15, 357/45, 71; 350/336

[56] References Cited

U.S. PATENT DOCUMENTS

| 4,843,438 | 6/1989 | Koden et al. | 357/4 |
| 4,857,907 | 8/1989 | Koden | 357/23.7 |
| 5,075,674 | 12/1991 | Katayama et al. | 340/719 |

FOREIGN PATENT DOCUMENTS

| 0233860 | 11/1985 | Japan | 357/23.7 |
| 0261174 | 12/1985 | Japan | 357/23.7 |
| 0134342 | 5/1989 | Japan | 357/23.7 |
| 2185622 | 7/1987 | United Kingdom | 357/4 |

Primary Examiner—Rolf Hille
Assistant Examiner—Peter Toby Brown
Attorney, Agent, or Firm—Morrison & Foerster

[57] ABSTRACT

A thin-film transistor array has an insulating substrate; a plurality of thin-film transistors disposed in a matrix form on the substrate; a plurality of gate bus lines formed parallel to each other on the substrate, each of the gate bus lines being connected electrically with the gate electrodes of the thin-film transistors in the corresponding row of the matrix; and a plurality of source bus lines formed perpendicular to the gate bus lines on the substrate, each of the source bus lines being connected electrically with the source electrodes of the thin-film transistors in the corresponding column of the matrix; wherein at the intersections of the gate bus lines and the source bus lines, there is disposed a layered structure between the gate bus line and the source bus line, having successively a gate insulating film, a first semiconductor film, a protective insulating film, and a second semiconductor film which is connected electrically with the source intersections, wherein the width of the protective insulating film in the direction in which the gate bus line extends is equal to or greater than that of the second semiconductor film in that direction.

7 Claims, 4 Drawing Sheets

THIN-FILM TRANSISTOR ARRAY

This application is a continuation of application Ser. No. 07/371,221, filed Jun. 26, 1989 and now abandoned.

BACKGROUND OF THE INVENTION

1. Field of the invention

This invention relates to an improvement in thin-film transistor arrays that are used in, for example, colored liquid-crystal display devices, and more particularly, to thin-film silicon transistor arrays with a thin-film structure improved at the intersections of the gate bus lines and the source bus lines.

2. Description of the prior art

As a typical example of conventional thin-film transistor arrays, FIG. 4 shows a thin-film silicon transistor array that is used in a liquid-crystal display panel. In this example, a number of thin-film transistors 1 are arranged in a matrix form to construct a liquid-crystal display device of the active-matrix type. Each thin-film transistor 1 is driven by the input of a scanning signal from the gate bus line 2. With the input of a picture signal from the source bus line 3, the liquid-crystal display panel is operated by the thin-film transistor 1 via the picture-element electrode 4.

In conventional thin-film transistor arrays of this type, intersections X1 of the gate bus lines 2 and the source bus lines 3 have the structure shown in FIGS. 5 to 7. That is, on the top of an insulating substrate 5 made of a glass or the like, there is formed the gate bus line 2 made of tantalum (Ta) with a thickness of 1000 to 4000Å. On the surface of the gate bus line 2, an insulating film 6 made of tantalum oxide ($Ta_2O_5$) is formed by anodic oxidation. Then, by plasma chemical vapor deposition, a layered structure is formed which comprises successively a gate insulating film 7 made of $SiN_x$ with a thickness of 1000 to 3000Å, an amorphous silicon (a-Si) film 8 with a thickness of 100 to 200Å, and a protective insulating film 9 made of $SiN_x$ with a thickness of 1000 to 4000Å. After the deposition of protective insulating film 9 patterning thereof is done by etching. Thereafter, a phosphorus-doped $n^+$-type a-Si film 10 with a thickness of 100 to 1000Å is deposited thereon, and the patterning of both the $n^+$-type a-Si film 10 and the a-Si film 8 at the same time gives the configuration shown in FIGS. 6 and 7. Moreover, the width of the $SiN_x$ protective insulating film 9 is less than that of the $n^+$-type a-Si film 10 and of the a-Si film 8 in both directions in which the gate bus line extends away from the intersection X1, as shown in FIG. 7.

The source bus line 3 and the drain bus line 11 (shown in FIG. 5) are formed on the layered structure mentioned above by the patterning of deposited Ti. The picture-element electrodes 4 are formed by the patterning of a transparent conductive film such as indium-tin-oxide (ITO) after the deposition.

With a liquid-crystal display device using the thin-film silicon transistor array mentioned above, cross talk between the picture elements can be reduced, resulting in a display with a large capacity and high picture quality.

At the present, various devices using a thin-film transistor array such as liquid-crystal display devices and the like are extremely expensive because of the complexity of the panel construction. The structure of the thin-film transistor array itself is as described above, so that it is difficult to reduce the production cost. Thus, the use of a more inexpensive driver to be connected may be considered as one way to reduce the cost of devices using a thin-film transistor array such as liquid-crystal display devices and the like.

However, in the intersection X1 of the source bus line 3 and the gate bus line 2 mentioned above for the conventional thin-film transistor arrays, the electric capacity is formed by the gate bus line 2, the insulating films 6, the gate insulating film 7, and the a-Si film 8; because this electric capacity is relatively large, the drive load becomes large. Therefore, it is necessary to connect a source driver and gate driver with large driving capacity, which makes it difficult to use inexpensive drivers.

SUMMARY OF THE INVENTION

The thin-film transistor array of this invention, which overcomes the above-discussed and numerous other disadvantages and deficiencies of the prior art, comprises an insulating substrate; a plurality of thin-film transistors disposed in a matrix form on said substrate; a plurality of gate bus lines formed parallel to each other on said substrate, each of said gate bus lines being connected electrically with the gate electrodes of the thin-film transistors in the corresponding row of said matrix; and a plurality of source bus lines formed perpendicular to said gate bus lines on said substrate, each of said source bus lines being connected electrically with the source electrodes of the thin-film transistors in the corresponding column of said matrix; wherein at the intersections of said gate bus lines and said source bus lines, there is disposed a layered structure between the gate bus line and the source bus line, comprising successively a gate insulating film, a first semiconductor film, a protective insulating film, and a second semiconductor film that is connected electrically with said source bus line; the improvement comprising that at said intersections, the width of said protective insulating film in the direction in which said gate bus line extends is equal to or greater than that of said second semiconductor film in said direction.

In a preferred embodiment, the insulating substrate is made of a glass.

In a preferred embodiment, the gate bus lines are made of tantalum and said source bus lines are made of titanium.

In a more preferred embodiment, the insulating film is made of tantalum oxide, formed on the surface of said gate bus lines by anodic oxidation.

In a preferred embodiment, the gate insulating film comprises an $SiN_x$ gate insulating film with a thickness of 1000 to 3000Å, said first semiconductor film comprises an amorphous silicon film with a thickness of 100 to 200Å, said protective insulating film comprises an $SiN_x$ protective insulating film with a thickness of 1000 to 4000Å, and said second semiconductor film comprises a phosphorus-doped $n^+$-type amorphous silicon film with a thickness of 100 to 1000Å.

In a preferred embodiment, the gate insulating film, said first semiconductor film, said protective insulating film, and said second semiconductor film are formed by plasma chemical vapor deposition.

Thus, the invention described herein makes possible the objectives of (1) providing a thin-film transistor array in which the protective insulating film separates the second semiconductor film formed above it electrically from the first semiconductor film formed below it, so that the electric capacity of the protective insulating film contributes to the electric capacity of the intersections of the source bus line and the gate bus line, thereby making it possible to decrease the electric capacity of the said intersections effectively; (2) providing a thin-film transistor array that has a lowered driving load, so that the drivers to be connected therewith require a lesser driving capacity, thereby making it possible to drive the display devices with more inexpensive drivers; (3) providing a thin-film transistor array by which the chips used in the drivers can be made smaller, so that the number of chips formed from a mother wafer increases, thereby making it possible to decrease the cost of the drivers; and (4) providing a thin-film transistor array that can make extremely large contributions to a decrease in the cost of the display devices such as colored liquid-crystal televisions.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

In the thin-film transistor array of this invention, the first semiconductor film formed above the gate bus line is regarded as a conductor, because electric charge is accumulated therein when the gate bus line is turned on. The protective insulating film formed on the first semiconductor film is wider than the second semiconductor film formed on the protective insulating film, or else is of the same width. Therefore, there is complete electrical separation between the first semiconductor film and the second semiconductor film in the said direction.

In this way, because there is complete electrical separation between the first semiconductor film and the second semiconductor film, the electric capacity is also formed by the first semiconductor film, the protective insulating film, and the second semiconductor film. This electric capacity is connected in series with the capacity that is formed by the gate bus line, the gate insulating film, and the first semiconductor film. For this reason, the total electric capacity of the intersections is decreased, so that the driving load of the thin-film transistor array can be decreased.

EXAMPLES

Figure 1:
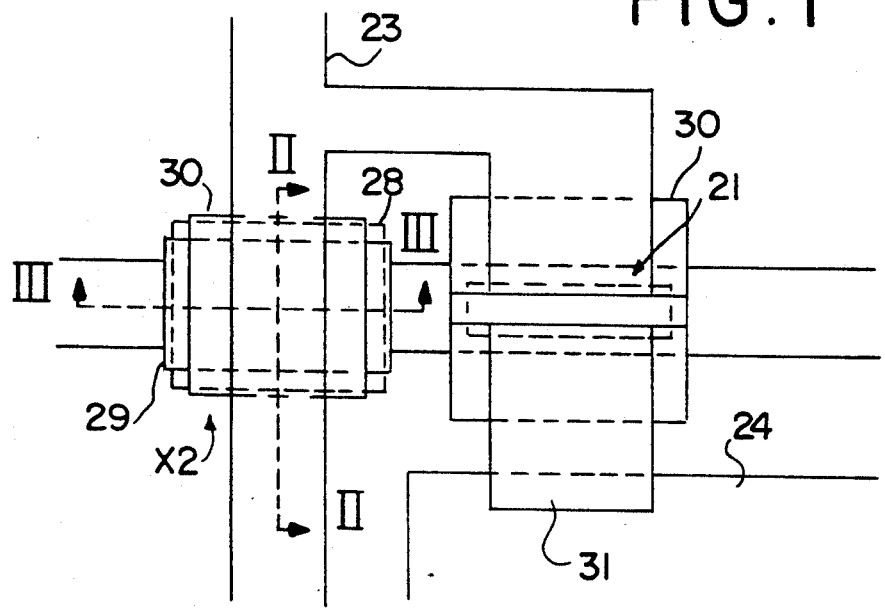
FIG. 1 is an enlarged top plan view showing a portion of a thin-film transistor array of this invention.
Figure 2:
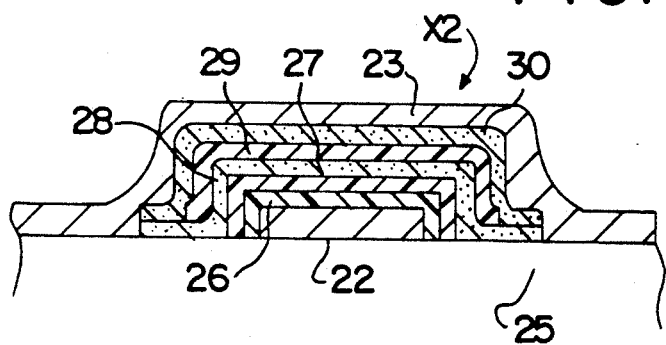
FIG. 2 is an enlarged cross-sectional view taken along line II—II of FIG. 1.
Figure 3:
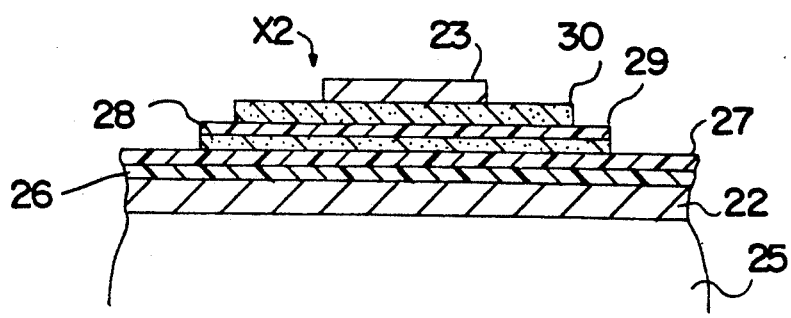
FIG. 3 is an enlarged cross-sectional view taken along line III—III of FIG. 1.
Figure 4:
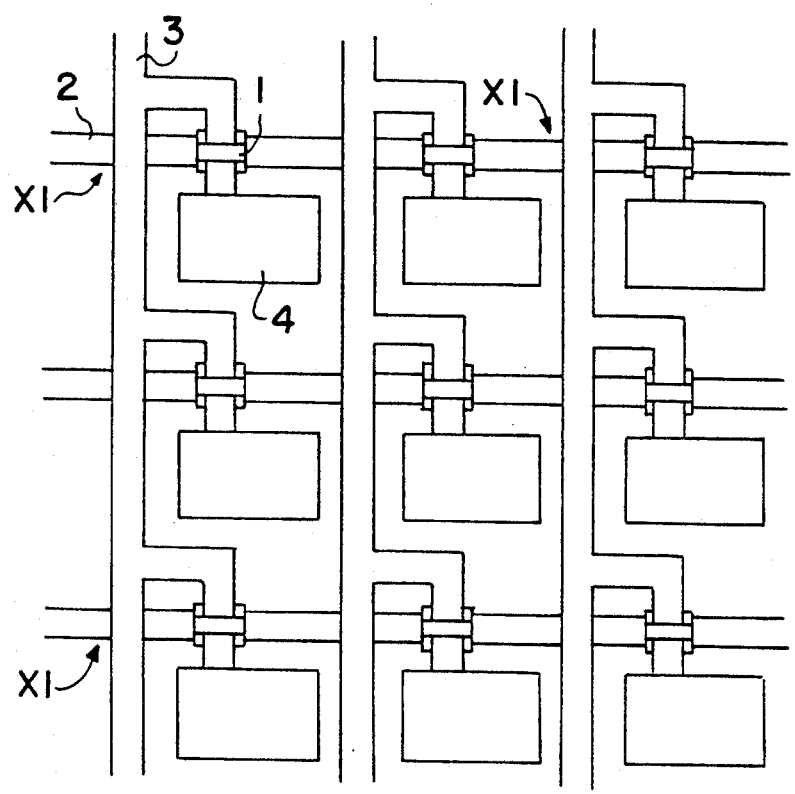
FIG. 4 is a schematic top plan view showing a liquid-crystal display device using a thin-film transistor array.
Figure 5:
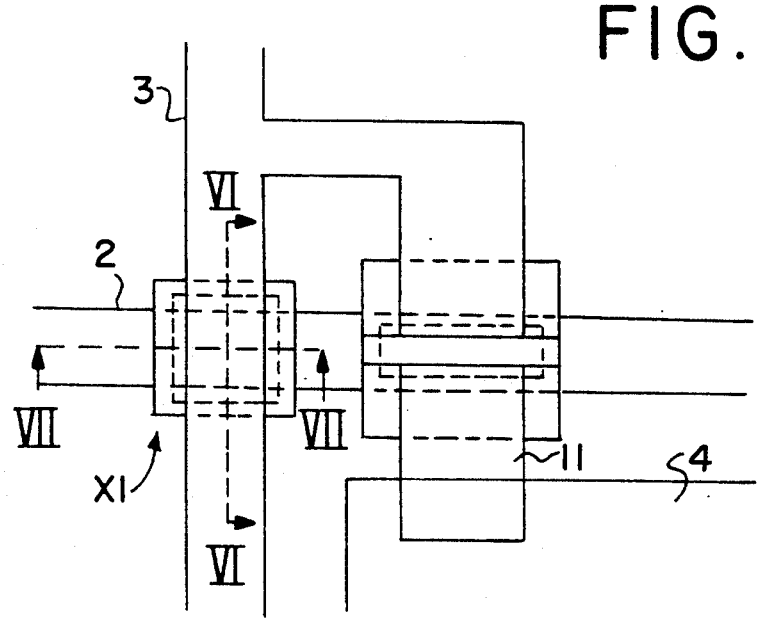
FIG. 5 is an enlarged top plan view showing a portion of a conventional thin-film transistor array.

FIG. 1 is an enlarged top plan view showing a portion of the thin-film silicon transistor array of this invention. FIGS. 2 and 3 are enlarged cross-sectional views taken along line II—II and line III—III respectively, of FIG. 1.

In FIG. 1, the example of this invention to be described below is illustrated at the intersection X2 of the gate bus line 22 and the source bus line 23. Moreover, in FIG. 1, reference numeral 21 is a thin-film transistor, and reference numeral 24 is a picture-element electrode. The manufacturing process of the thin-film silicon transistor array will hereinafter be described, of this example which makes clear the layered structure at the intersection X2.

First, on the top of an insulating substrate 25 made of a glass or the like, there is formed the gate bus line 22 made of tantalum (Ta) with a thickness of 1000 to 4000Å, and on the surface of the gate bus line 22, insulating film 26 made of tantalum oxide ($Ta_2O_5$) is formed by anodic oxidation. Then, by plasma chemical vapor deposition, a layered structure is formed which comprises successively a gate insulating film 27 made of $SiN_x$ with a thickness of 1000 to 3000Å, an amorphous silicon (a-Si) film 28 with a thickness of 100 to 200Å, and a protective insulating film 29 made of $SiN_x$ with a thickness of 1000 to 4000Å. Next, patterning of this $SiN_x$ protective insulating film 29 is done by etching.

Thereafter, phosphorus-doped $n^+$-type a-Si film 30 with a thickness of 100 to 1000Å is deposited thereon, and this $n^+$-type a-Si film 30 and the a-Si film 28 are patterned at the same time. At this time, the width of the $n^+$-type a-Si film 30 is made less than that of the SiNx protective insulating film 29 at both sides in the direction in which the gate bus line 22 extends, as shown in FIG. 3.

Then, the source bus line 23 and the drain bus line 31 are formed by the patterning of deposited Ti, which is the metal used for the source and the drain bus lines. Moreover, a transparent conductive film made of indium-tin-oxide (ITO) is deposited and patterned to form the picture elements 24.

The operation of this example will hereinafter be explained by reference to FIGS. 8 to 11 in comparison with the conventional example given above. In FIGS. 8 to 11, only the portions that are regarded as a conductor are hatched.

(1) Electric capacity of the intersection X1 in the conventional example

Figure 6:
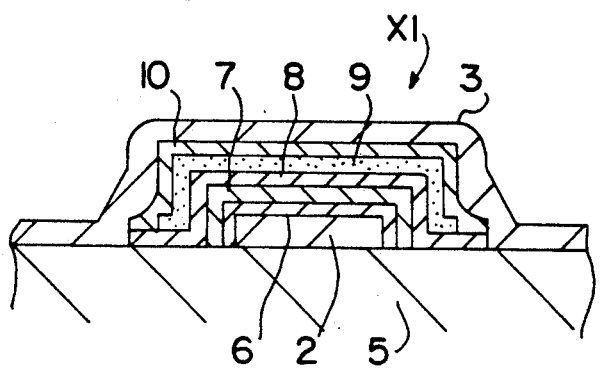
FIG. 6 is an enlarged cross-sectional view taken along line IV—IV of FIG. 5.
Figure 7:
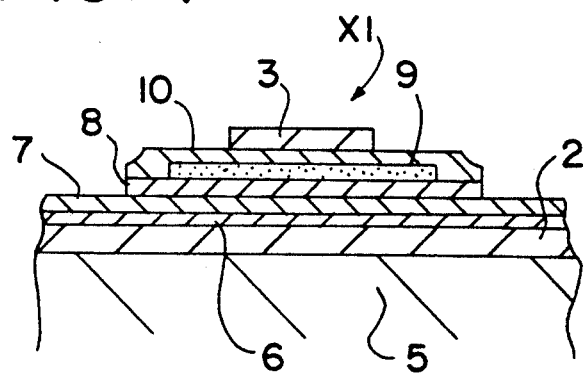
FIG. 7 is an enlarged cross-sectional view taken along line VII—VII of FIG. 5.
Figure 8:
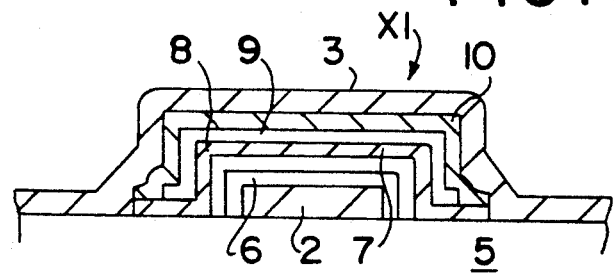
FIGS. 8 and 9 are enlarged cross-sectional views for illustrating the operation of the conventional thin-film transistor array.
Figure 9:
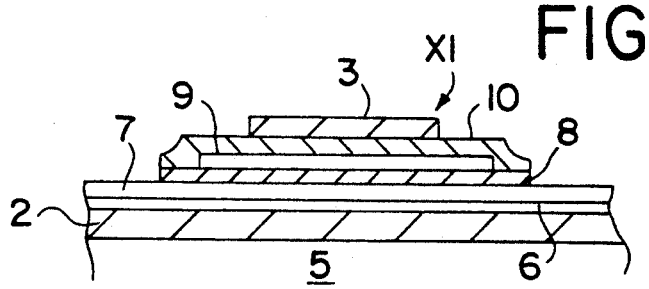

FIGS. 8 and 9 are enlarged cross-sectional views showing the same conventional example as in FIGS. 6 and 7. In the conventional example, when the gate bus line 2 is turned on, there is accumulation of electric charge in the a-Si film 8 formed above the gate bus line 2. Therefore, as is shown by the hatching in FIGS. 8 and 9, the a-Si film 8 can be regarded as a conductor. The $SiN_x$ protective insulating film 9 is enclosed with the conductors (i.e., the portions shown by the slanted hatching in FIGS. 8 and 9), so that the electric capacity of the intersection X1 is not affected by the protective insulating film 9. Thus, the electric capacity of the intersection X1 can be considered to be formed by the $Ta_2O_5$ insulating film 6 and the $SiN_x$ protective insulating film 7 only. Therefore, when the electric capacity of the $Ta_2O_5$ insulating film 6 is Ca, and the electric capacity of the $SiN_x$ protective insulating film 7 is Cb, the total electric capacity $C_1$ of the intersection X1 is given by the expression:

$$(1/C_1) = (1/Ca) + (1/Cb)$$

(2) Electric capacity of the intersection X2 in the example of this invention

Figure 10:
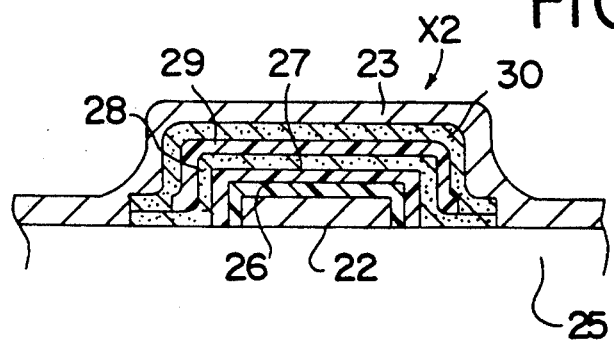
FIGS. 10 and 11 are enlarged cross-sectional views for illustrating the operation of the thin-film transistor array of FIG. 1.
Figure 11:
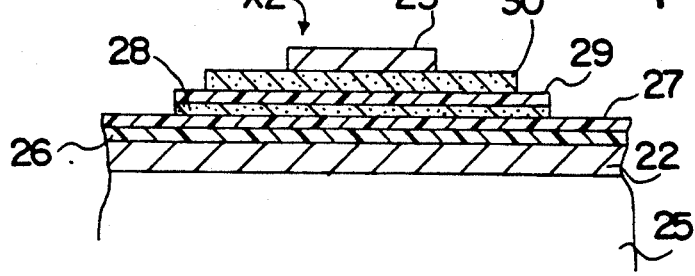

Next, the electric capacity of the intersection X2 in the example given above will be considered by reference to FIGS. 10 and 11. When the gate bus line 22 is turned on, as described above, there will be accumulation of electric charge in the a-Si film 28 formed above the gate bus line 22; the portions with hatching in these figures can be regarded as a conductor. In this example, as can be seen from FIG. 11, the $SiN_x$ protective insulating film 29 completely separates the a-Si film 28 and the $n^+$-type a-Si film 30 from each other. Thus, the electric capacity of the intersection X2 is affected by the electric capacity of this $SiN_x$ protective insulating film 29. Therefore, when the electric capacity based on the $SiN_x$ protective insulating film 29 is Cx, the total electric capacity $C_2$ of the intersection X2 is given by the expression:

$$(1/C_2) = (1/Ca) + (1/Cb) + (1/Cx)$$

As is clear from the expressions to calculate $C_1$ and $C_2$, the inequality $C_2 < C_1$ nodes. Therefore, according to the example of this invention, the electric capacity of the intersections of the source bus lines and the gate bus lines can be effectively decreased in comparison with the electric capacity in the conventional example.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a thin-film transistor array comprising:
   an insulating substrate;
   a plurality of thin-film transistors disposed in a matrix form on said substrate;
   a plurality of gate bus lines formed parallel to each other on said substrate, each of said gate bus lines being connected electrically with the gate electrodes of the thin-film transistors in the corresponding row of said matrix; and
   a plurality of source bus lines formed perpendicular to said gate bus lines on said substrate, each of said source bus lines being connected electrically with the source electrodes of the thin-film transistors in the corresponding column of said matrix;
   wherein at the intersections of said gate bus lines and said source bus lines, there is disposed a layered structure between the gate bus line and the source bus line, comprising successively a gate insulating film a first semiconductor film made of amorphous silicon, a protective insulating film, and a second semiconductor film connected electrically with said source bus line;
   the improvement comprising that at said intersections, the width of said protective insulating film in the direction in which said gate bus line extends is equal to or greater than that of said second semiconductor film in said direction and said first semiconductor film is separated from the thin-film transistor.

2. A thin-film transistor array according to claim 1, wherein said insulating substrate is made of a glass.

3. A thin-film transistor array according to claim 1, wherein an insulating film made of tantalum oxide is formed on the surface of said gate bus lines by anodic oxidation.

4. A thin-film transistor array according to claim 1, wherein said gate insulating film comprises an $SiN_x$ gate insulating film with a thickness of 1000 to 3000Å, said first semiconductor film comprises an amorphous silicon film with a thickness of 100 to 200 Å, said protective insulating film comprises an $SiN_x$ protective insulating film with a thickness of 1000 to 4000Å, and said second semiconductor film comprises a phosphorus-doped $n^+$-type amorphous silicon film with a thickness of 100 to 1000Å.

5. A thin-film transistor array according to claim 1, wherein said gate insulating film, said first semiconductor film, said protective insulating film, and said second semiconductor film are formed by plasma chemical vapor deposition.

6. A thin-film transistor array according to claim 1, wherein said gate bus lines are made of tantalum and said source bus lines are made of titanium.

7. A thin-film transistor array comprising:
   an insulating substrate made of glass;
   a plurality of thin-film transistors disposed in a matrix form on said substrate;
   a plurality of gate bus lines made of tantalum, said gate bus lines being formed parallel to each other on said substrate and connected electrically with the gate electrodes of the thin-film transistors in the corresponding row of said matrix;
   a plurality of source bus lines consisting of titanium, formed perpendicular to said gate bus lines on said substrate and connected electrically with the source electrodes of the thin-film transistors in the corresponding column of said matrix; and
   a layered structure disposed between the gate bus line and the source bus line at the intersections thereof, comprising successively at gate insulating film made of $SiN_x$ with a thickness of 1000 to 3000Å, a first semiconductor film made of amorphous silicon with a thickness of 100 to 200Å, a protective insulating film made of $SiN_x$ with a thickness of 1000 to 4000Å, and a second semiconductor film made of phosphorous-doped $n^+$-type amorphous silicon with a thickness of 100 to 1000Å, said second semiconductor film being connected electrically with said source bus line, wherein the width of said protective insulating film in the direction in which said gate bus line extends is equal to or greater than that of said second semiconductor film in said direction and said first semiconductor film is separated from the thin-film transistor.

* * * * *